United States Patent
Lin et al.

(10) Patent No.: US 6,309,976 B1
(45) Date of Patent: Oct. 30, 2001

(54) CRITICAL DIMENSION CONTROLLED METHOD OF PLASMA DESCUM FOR CONVENTIONAL QUARTER MICRON AND SMALLER DIMENSION BINARY MASK MANUFACTURE

(75) Inventors: Tzy-Ying Lin, Hsin-Chu; Cheng-Lung Duan, Taipei; Tsung-Wen Tien, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/272,532

(22) Filed: Mar. 22, 1999

(51) Int. Cl.[7] .................... H01L 21/302; H01L 21/3065; H01L 21/461
(52) U.S. Cl. .................... 438/706; 438/725; 438/745
(58) Field of Search .................... 438/706, 725, 438/745

(56) References Cited

U.S. PATENT DOCUMENTS

| | | | |
|---|---|---|---|
| 4,529,860 | 7/1985 | Robb | 219/121 |
| 4,800,251 | 1/1989 | Matsuoka | 219/121.43 |
| 4,938,839 | * 7/1990 | Fujiumra et al. | 156/628 |
| 4,959,326 | 9/1990 | Roman et al. | 437/40 |
| 5,200,360 | 4/1993 | Bradburg et al. | 437/192 |
| 5,246,799 | * 9/1993 | Pierrat | 430/4 |
| 5,258,093 | * 11/1993 | Maniar | 156/626 |
| 5,259,924 | 11/1993 | Mathews et al. | 156/653 |
| 5,380,608 | * 1/1995 | Miyashita et al. | 430/5 |
| 5,393,374 | * 2/1995 | Sato et al. | 156/643 |
| 5,637,186 | 6/1997 | Liu et al. | 438/14 |
| 5,783,099 | * 7/1998 | Huh | 216/59 |
| 5,783,366 | * 7/1998 | Chen et al. | 430/311 |
| 5,798,303 | 8/1998 | Clampitt | 438/696 |
| 5,880,019 | 3/1999 | Hsieh et al. | 438/666 |
| 5,976,968 | * 11/1999 | Dai | 438/622 |

FOREIGN PATENT DOCUMENTS

| | | | |
|---|---|---|---|
| 55143560A | * 11/1980 | (JP) | 438/780 |
| 55144247 | * 11/1980 | (JP) | G03F/1/00 |
| 58024143 A | * 2/1983 | (JP) | 430/5 |

OTHER PUBLICATIONS

Yamazaki et al., Manufacture of Photomask, JP 55143560 A, English Abstract, 2 pages, Nov. 1980.*
Arii et al., Photomask, JP 58024143 A, English Abstract, 2 pages, Feb. 1983.*
Mitsubishi Electric Corp., Photomask preparation—by forming masking layer on glass base, applying polymeric layer, irradiating to evaporate polymer and form mask and etching, etc., JP 55144247 A, English Abstract, 2 pagesl, Nov. 1980.*
Wolf et al., Silicon Processing for the VLSI Era: vol. 1—Process Technology, Lattice Press, pp. 429, 449, and 484, 1986.*

* cited by examiner

Primary Examiner—Robert Kunemund
Assistant Examiner—Lynette T. Umez-Eronini
(74) Attorney, Agent, or Firm—Geroge O. Saile; Stephen B. Ackerman; Graham S. Jones, II (57) ABSTRACT

A method of forming a mask from a metal layer deposited upon a substrate patterned for exposure of a workpiece to radiation of a specific range of wavelengths with the substrate being transparent to the radiation comprises the following steps. Form the metal layer superjacent to the substrate. Form a photoresist layer superjacent to the metal layer. Expose the photoresist layer to a pattern. Develop the photoresist to Form a photoresist mask with an opening therethrough. Bake the photoresist mask, the metal layer and the substrate. Perform a descum operation. Perform an isotropic etching of the metal layer through the opening in the mask. Perform an after etching inspection measurement. Strip the photoresist mask. Perform an after stripping inspection measurement. The isotropic etching is performed with a wet etchant. The descum operation is performed with a dry plasma process including oxygen and nitrogen gases and an inert gas selected from argon and helium.

24 Claims, 7 Drawing Sheets

CRITICAL DIMENSION CONTROLLED METHOD OF PLASMA DESCUM FOR CONVENTIONAL QUARTER MICRON AND SMALLER DIMENSION BINARY MASK MANUFACTURE

BACKGROUND OF THE INVENTION

1. Field of the Invention

This invention relates to semiconductor devices and more particularly to masks for patterning semiconductor devices.

2. Description of Related Art

U.S. Pat. No. 5,798,303 of Clampitt for "Etching Method for Use in Fabrication of Semiconductor Devices" describes an oxygen plasma descum method using oxygen to remove a polymer material by etching using "a descum step 14, such as, for example, an oxygen plasma descum, to selectively etch the blocking material from the substantially vertical sidewall of the device . . . ", Col. 3, lines 54–65. Referring to Col. 5, 26–41, polymer blocking material 64, 66 forms over sidewall spacers 46/52 during the removal of conductive material 60 which is not protected by the photoresist 62. The blocking material 64/66 must be removed from the device. An inert carrier such as helium can be incorporated with the oxygen in the plasma. (Col. 6, lines 19–18.) A fluorine containing gas and oxygen plasma can be used (Col. 7, lines 7–17.)

U.S. Pat. No. 5,637,186 of Liu et al. for "Method and Monitor Testsite Pattern for Measuring Critical Dimension Openings" describes measurement of After Development Inspection (ADI) and After Etching Inspection (AEI) for layers of photoresist, see Col. 4, lines 49–67.

U.S. Pat. No. 4,800,251 of Matsuoka for "Apparatus for Forming a Resist Pattern" U.S. Pat. No. 5,200,360 of Bradbury et al. for "Method for Reducing Selectivity Loss in Selective Tungsten Deposition", and U.S. Pat. No. 5,259,924 of Mathews et al. for "Integrated Circuit Fabrication Process to Reduce Critical Dimension During Etching" show plasma descum methods.

U.S. Pat. No. 4,529,860 of Robb for "Plasma Etching of Organic Materials" shows a plasma etching (descum) process.

U.S. Pat. No. 4,959,326 of Roman et al. for "Fabricating T-Gate MESFETS Employing Double Exposure, Double Develop Techniques" teaches a double exposure technique to improve photo accuracy.

SUMMARY OF THE INVENTION

The process of this invention provides a way to provide a critical dimension controlled method of descum for conventional quarter micron (0.25 µm) and smaller dimension (0.18 µm) binary mask manufacture.

This invention teaches a method to improve ASTRIPI (After STRIPping Inspection) target by adding an etch step depending on AEI (After Etching Inspection) measurement. The invention uses plasma descum that improves the CD (Critical Dimension).

We have found that it is possible to use a method of controlling the ASTRIPI mean value by an Adding Etching (AE) method which involves addition to the system of an isotropic etchant which etches away the mask material to etch away the sidewalls of openings in the mask as a function of time.

The adding etching (AE) method makes it necessary to estimate the Side Etching Value (SEV) so that the correct amount of material is removed from the sidewalls of the openings in the mask. Sidewall etching is a process in which an etching gas is added to the system to etch away unwanted sidewall material in the openings in the mask. The sidewall etching step is followed by an ASTRIPI (After STRIPping Inspection) step.

The value of a Side Etching Value (SEV) step depends on developing the pattern profile, the resistance thickness, the pattern density, the pattern tone, and the pattern critical dimensions.

Since the range of the Side Etching Value (SEV) which results from the SEV process is from about 50 nm to about 120 nm, it is difficult to decide what parameters will provide a suitable Adding Etching (AE) program. On the one hand too little side etching occurs. On the other hand too much side etching occurs and there is a problem of serious undercut.

An object of this invention is to reduce the error budget by eliminating the sidewall etching value estimated error.

A further object of this invention is to simplify the processing steps.

An object of this invention is to control the CD (Critical Dimension) mean value range well within ±20 nm of CD.

In accordance with this invention, a method is provided for forming a mask from a metal layer deposited upon a substrate patterned for exposure of a workpiece to radiation of a specific range of wavelengths with the substrate being transparent to the radiation comprises the following steps. Form the metal layer superjacent to the substrate. Form a photoresist layer superjacent to the metal layer. Expose the photoresist layer to a pattern. Develop the photoresist to Form a photoresist mask with an opening therethrough. Bake the photoresist mask, the metal layer and the substrate. Perform a descum operation. Perform an isotropic etching of the metal layer through the opening in the mask. Perform an after etching inspection measurement. Strip the photoresist mask. Perform an after stripping inspection measurement. The isotropic etching is performed with a wet etchant.

Preferably, the descum operation is performed with a dry plasma process including oxygen and nitrogen gases and an inert gas selected from argon and helium.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
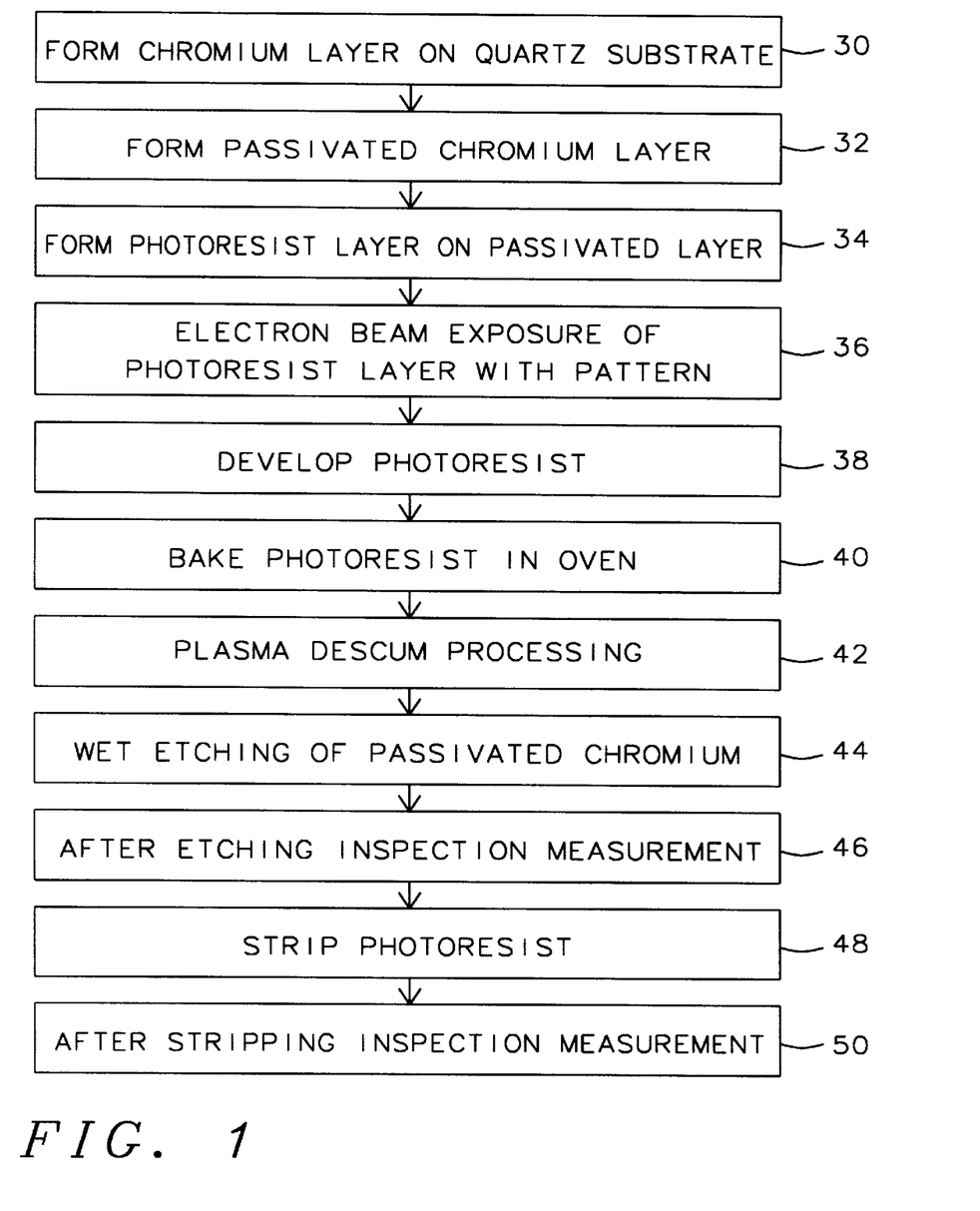
FIG. 1 shows a flow chart of the method of this invention.

FIG. 1 shows a flow chart of the method of this invention.

Figure 2:
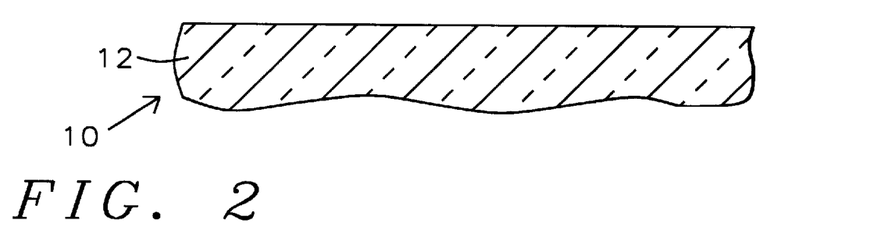
FIGS. 2–9 show sectional views of a mask in accordance with this invention in a series of stages of manufacture.

FIG. 2 shows a sectional view of a mask 10 in the first stage of manufacture in which a quartz substrate 12 is to be formed into a metal mask, as described below in accordance with the method shown in FIG. 1.

Figure 3:
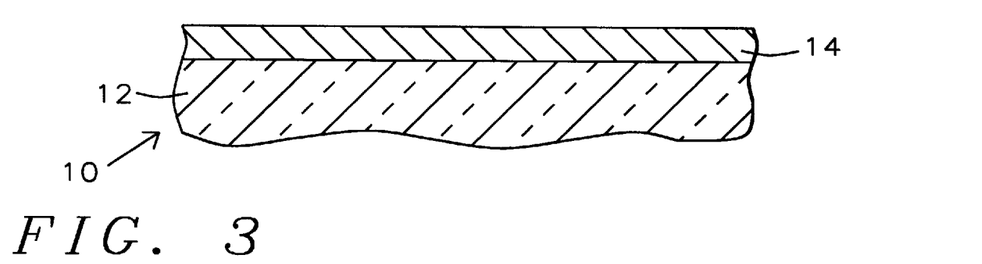

FIG. 3 shows a sectional view of the mask 10 of FIG. 2, in an early stage of being manufacture, after a blanket chromium layer 14 has been formed superjacent to (above) the quartz substrate 12, as indicated by step 30 of the method of FIG. 1. Chromium layer 14 which has a thickness from about 800 Å to about 1080 Å is deposited by evaporation or sputtering of chromium in a vacuum chamber.

Figure 4:
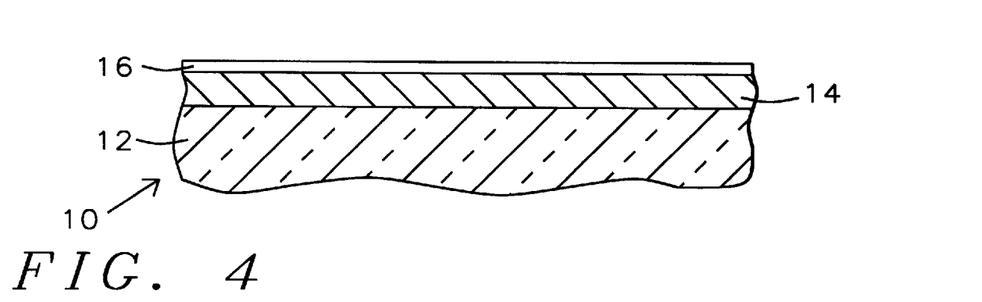

FIG. 4 shows a sectional view of the mask 10 of FIG. 3, after a thin chromium oxide ($CrO_2$) passivation layer 16 has been formed superjacent to (above) the blanket chromium layer 14, as indicated by step 32 of the method of FIG. 1. Chromium oxide ($CrO_2$) passivation layer 16 has a thickness from about 80 Å to about 120 Å.

Figure 5:
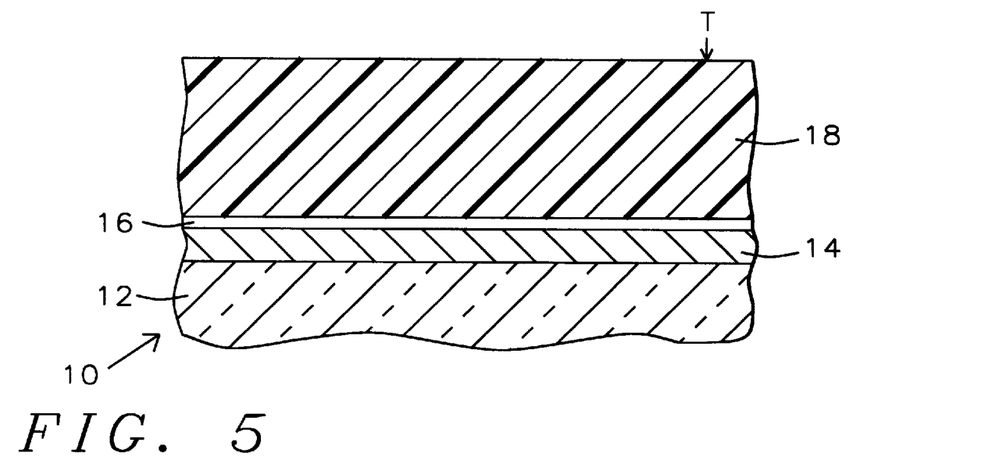

FIG. 5 shows a sectional view of the mask 10 of FIG. 4, after a blanket layer of photoresist mask 18 with a top surface T has been formed superjacent to (above) the passivation layer 16, as indicated by step 34 of the method of FIG. 1.

Figure 6:
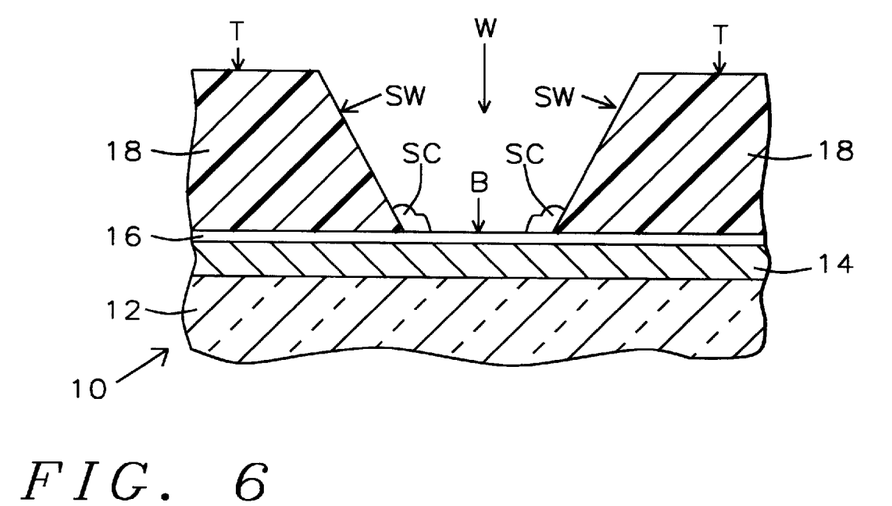

FIG. 6 shows a sectional view of the mask 10 of FIG. 5, after mask 18 has been exposed to a pattern including a window W seen in FIG. 6, in accordance with step 36 of FIG. 1 of a conventional electron beam exposure system and developed in accordance with step 38 of FIG. 1.

After the photoresist 18 has been developed, there is a window W therethrough with sidewalls SW reaching down to the bottom B of window W at the surface of the passivation layer 16. The window W has sloping sidewalls SW with an angle Θ relative to vertical of about 20° relative to the surface of layer 16. The angle Θ is substantially less than the ideal vertical angle (90°) for the sidewalls SW.

In step 40 in FIG. 1, the photoresist 18 of FIG. 6 has been baked in an oven at a temperature of from about 118° C. to about 122° C. for a time from about 30 min. to about 60 min.

After step 40 in FIG. 1, mask 10 is as shown in FIG. 6 with a layer of scum SC which was formed near the bottom B of window W which partially covers the surface of sidewalls SW and the top surface of layer 16 at the bottom B of window W where the sidewalls SW meet the surface of thin passivation layer 16.

Figure 7:
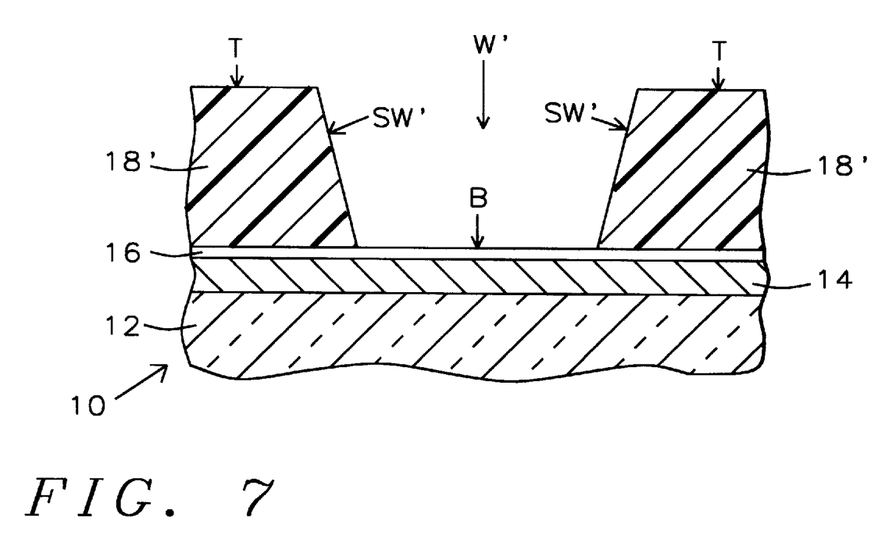

FIG. 7 shows mask 10 of FIG. 6 after a plasma descum treatment step 42 in FIG. 1 during which the scum SC is etched away from the top surface of the thin passivation layer 16 of chromium oxide ($CrO_2$) and the sidewalls SW of photoresist mask 18 which have been etched to form more vertical sidewalls SW' of photoresist mask 18', so that the opening at the bottom of the window W' in FIG. 7 is wider than the window W in FIG. 6.

Plasma Descum Process Recipes

EXAMPLE I

Initial recipe $O_2/N_2$=0.1 to 0.4
pressure=50 mTorr to 100 mTorr (moderate pressure)
DC bias=10 V to 50 V

EXAMPLE II

Inert gas (Ar/He)
mixed with $O_2/N_2$=0.1 to 0.4
pressure=10 mTorr to 30 mTorr (low pressure)
DC bias=60 V to 90 V (increase ion bombardment using inert Ar/He gases at lower pressure)

The result is that photoresist side etching decreases as a result of increased ion bombardment as a result of a higher DC bias.

There is a consistent profile of the photoresist sidewall independent of the ADI.

There is also an improved mean value control of ASTRIPI.

Figure 8:
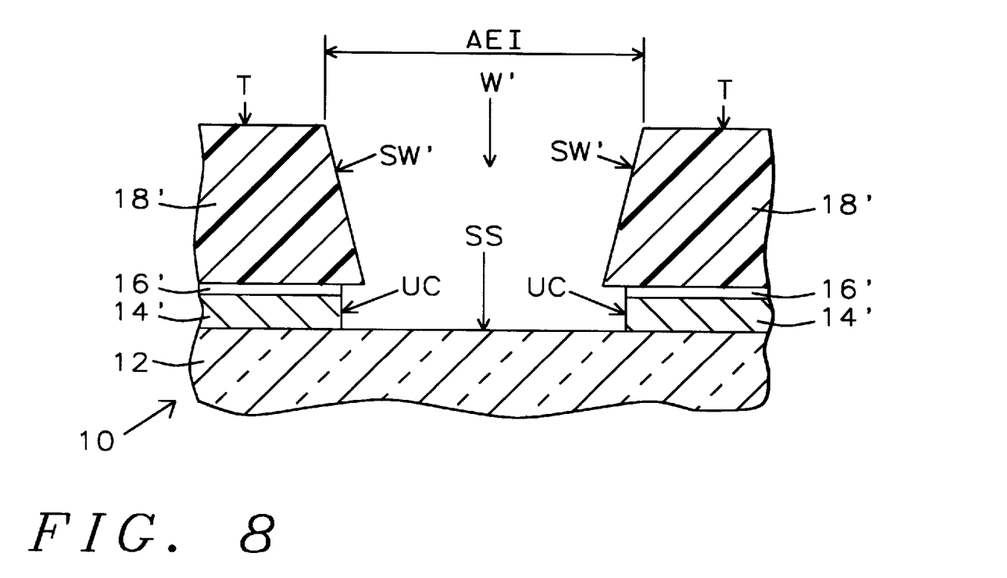

FIG. 8. shows the mask 10 of FIG. 7 after step 44 in FIG. 1 which is wet, isotropic etching of the chromium oxide ($CrO_2$) layer 16 and chromium layer 14 to form layers 16' and 14' with a hole therethrough down to the surface of quartz substrate 12 and with an undercut UC beneath the edge of photoresist mask 18'. The surface SS of the quartz substrate 12 is exposed below the window W'. The preferred etchants are chlorofluorocarbons (CFC's).

The width of the opening in layers 16' and 14' cannot be measured, at this point, since its width is partially obscured by the mask 18'. Thus, the only measurement which can be made is the After Etching Inspection (AEI) dimension which is measured with an AMS310T in step 46 in FIG. 1. However, this measurement is made without "seeing" the undercut UC. At this point it is possible to employ an adding etching step following which an under-cut estimating step can be performed but this is a relatively speculative process.

Figure 9:
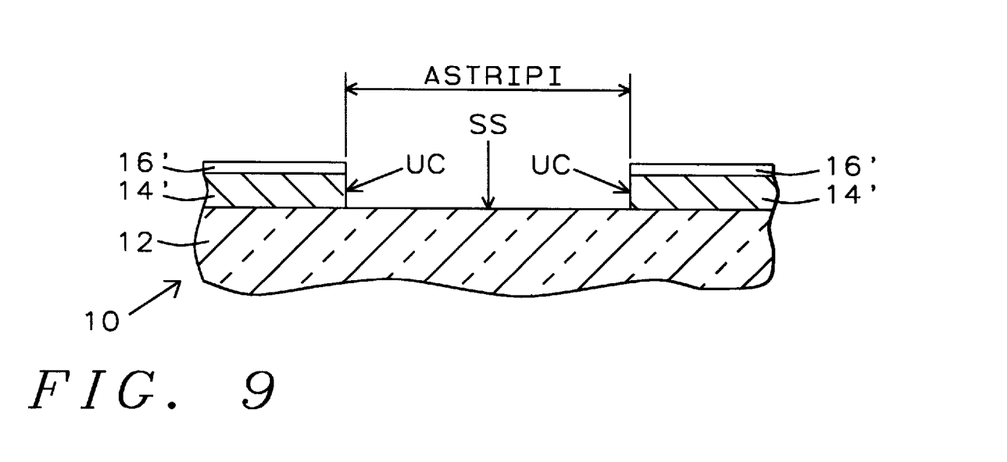

FIG. 9. shows the mask 10 of FIG. 8 after step 48 in FIG. 1 stripping the photoresist mask 18' from the surface of layer 16' in accordance with step 48 in FIG. 1.

The next measurement which can now be made is the After Stripping Inspection (ASTRIPI) dimension which is measured with measurement in step 50 in FIG. 5, with apparatus such as a Nikon XY-3I laser interferometric system.

Figure 10:
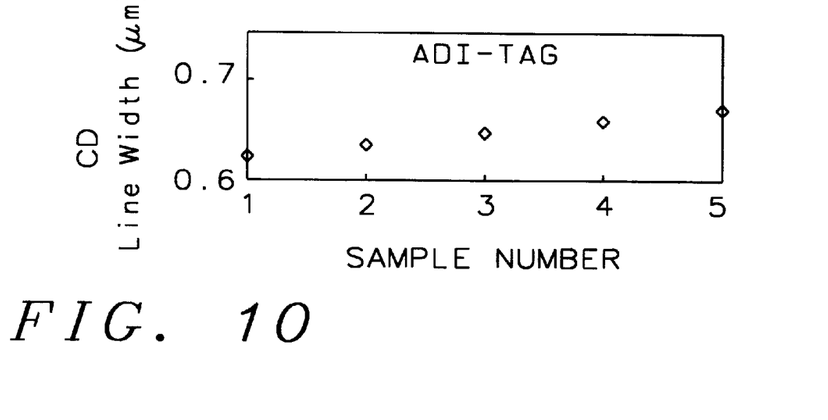
FIGS. 10–16 are graphs of critical dimension vs. sample number for ADI, AEI, and ASI as indicated.

FIG. 10 is a graph which shows different ADI-target values relative to different plasma recipes with the critical dimension line width in micrometers ($\mu$m) vs. sample number (positive integer). Sample 1 uses a first plasma recipe, sample 2 uses a second plasma recipe, etc. For different ADI-targets.

Figure 11:
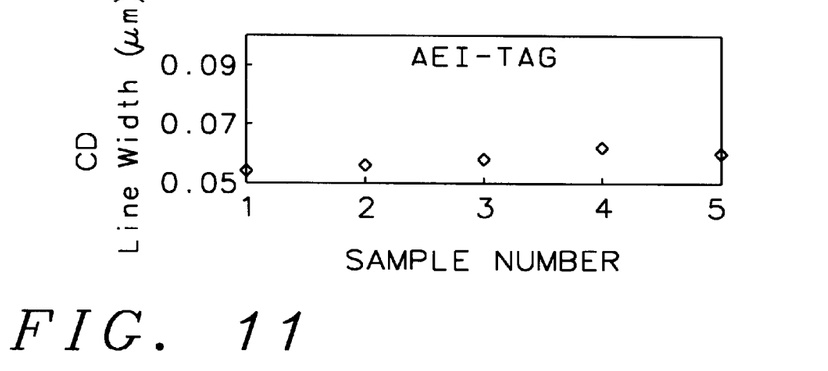

FIG. 11 is a graph which shows an AEI-target values chart with the critical dimension line width in micrometers ($\mu$m) vs. sample number (positive integer), as in FIG. 10.

Figure 12:
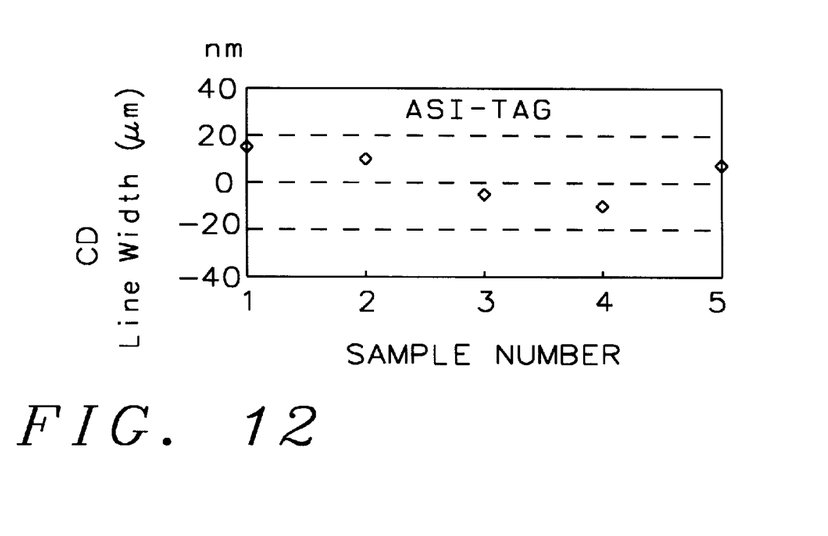

FIG. 12 is a graph which shows an ASTRIPI (ASI)-target chart with the critical dimension line width in micrometers ($\mu$m) vs. sample number (positive integer), as in FIG. 10.

Figure 13:
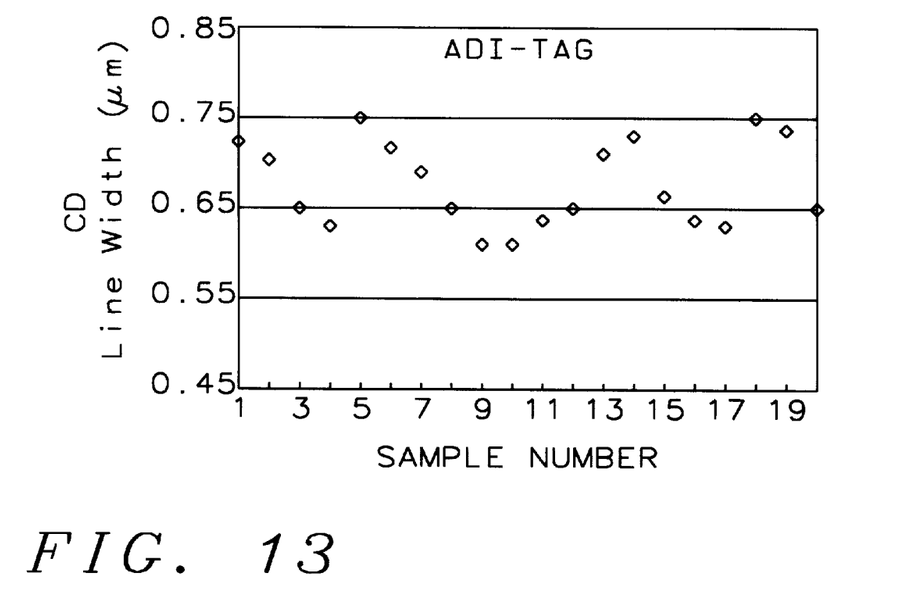

FIG. 13 is a graph which shows an ADI-target chart with the critical dimension line width range from 0.75 $\mu$m down to 0.60 $\mu$m vs. sample number (positive integer), as in FIG. 10.

Figure 14:
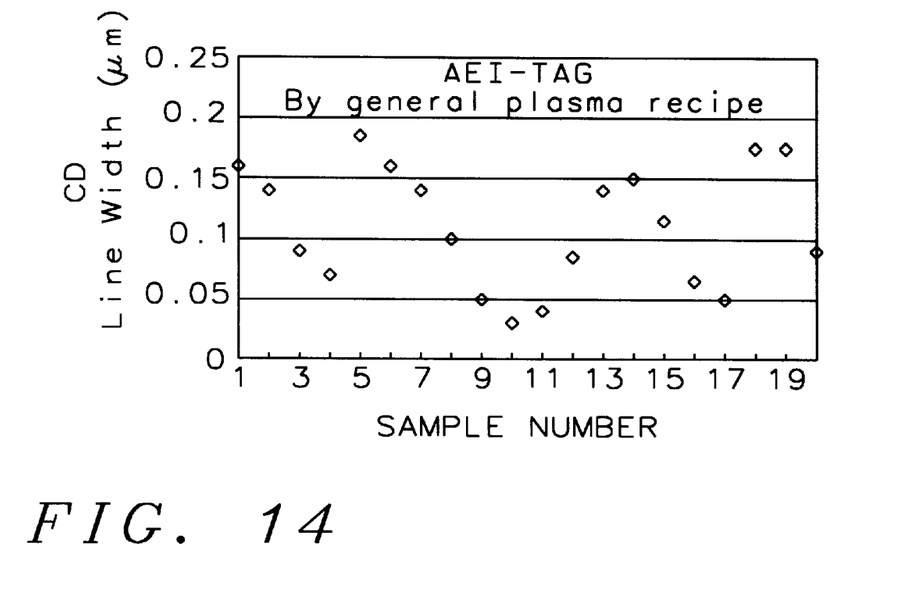

FIG. 14 is a graph which shows an AEI-target chart with the critical dimension line in micrometers ($\mu$m) vs. sample number (positive integer), as in FIG. 10. The AEI value is dependent on ADI value by general plasma recipe.

Figure 15:
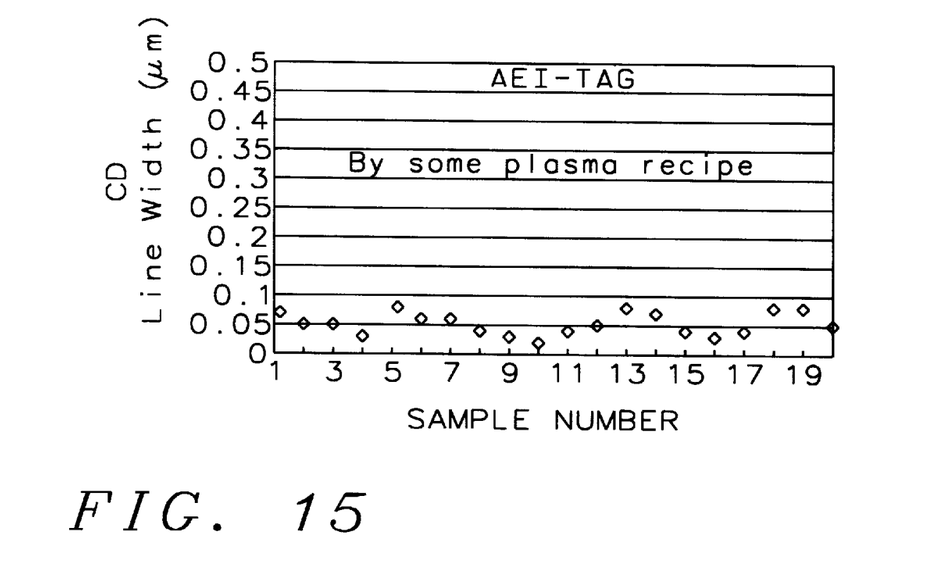

FIG. 15 is a graph which shows an AEI-target chart with the critical dimension line in micrometers ($\mu$m) vs. sample number (positive integer), as in FIG. 10. For a specific plasma recipe, side etching rate low and a large vertical etching rate, the AEI value is independent of ADI value by this general plasma recipe.

Figure 16:
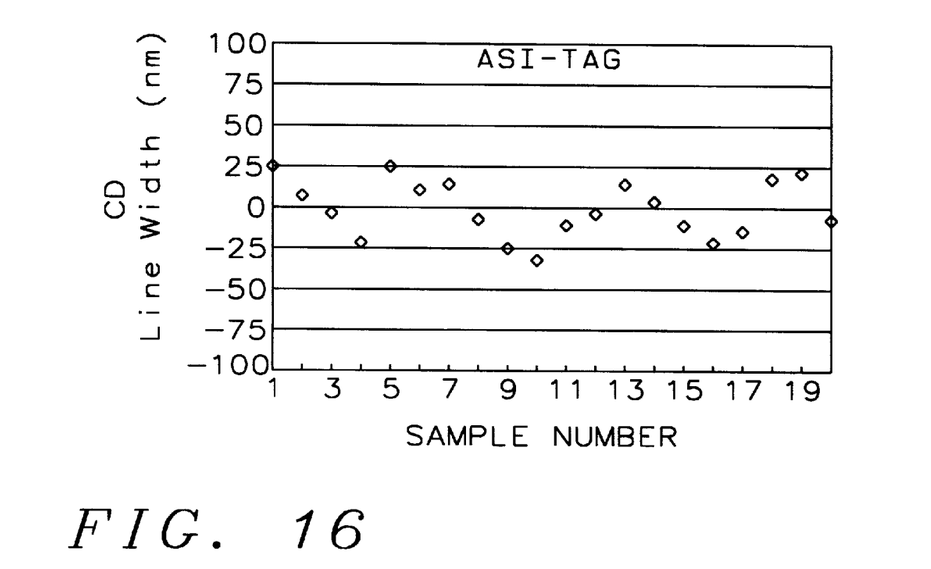

FIG. 16 is a graph which shows an ASTRIPI (ASI)-target chart with the critical dimension line in micrometers ($\mu$m) vs. the sample number (positive integer), as in FIG. 10 with a mean value range below 50 nm.

With this process it is possible to estimate undercut and then to remove photoresist and measure as follows:

$$\text{Undercut} = |\text{ASTRIPI} - \text{AEI}|$$

It is an absolute value because the mask is clear or dark (opaque). The under-cut is relative to→After Development Inspection (ADI) profile, CD size, pattern density, and clear/dark ratio.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of performing a descum operation during fabrication of a metal mask from a metal layer deposited upon a quartz substrate patterned for exposure of a workpiece to radiation with said substrate being transparent to said radiation of a specific range of wavelengths, said method comprising the steps as follows:

first form said metal layer composed of a masking metal upon said quartz substrate, then form a passivated metal layer on said metal layer, then form a photoresist mask superjacent to said passivated metal layer with at least one opening therethrough with sidewalls of said at least one opening having sidewall angles θ substantially less than an ideal vertical angle (90°), then bake said photoresist mask, said metal layer and said substrate, then perform a descum operation to widen said at least one opening thereby forming more vertical sidewalls of said photoresist mask, then perform an isotropic etching of said metal layer with a wet etchant etching through said at least one opening through said photoresist mask to form said metal mask, then perform an after etching inspection measurement of said metal mask, then strip said photoresist mask, and then perform an after stripping inspection measurement of said metal mask.

2. The method of claim 1 wherein said isotropic etching is performed with a wet etchant providing an undercut beneath the edge of said photoresist mask.

3. The method of claim 1 wherein said descum operation is performed with a dry plasma process.

4. The method of claim 1 wherein said descum operation is performed with a dry plasma process including oxygen and nitrogen gases.

5. The method of claim 1 wherein said descum operation is performed with a dry plasma process including oxygen gas and an inert gas.

6. The method of claim 1 wherein said descum operation is performed with a dry plasma process including oxygen and nitrogen gases and an inert gas.

7. The method of claim 1 wherein said descum operation is performed with a dry plasma process including oxygen and nitrogen gases and an inert gas selected from argon and helium.

8. The method of claim 1 wherein:

said isotropic etching is performed with a wet etchant providing an undercut beneath the edge of said photoresist mask, and said descum operation is performed with a dry plasma process.

9. The method of claim 1 wherein:

said isotropic etching is performed with a wet etchant providing an undercut beneath the edge of said photoresist mask, and said descum operation is performed with a dry plasma process including oxygen and nitrogen gases as follows:

Initial recipe $O_2/N_2$=0.1 to 0.4; pressure=50 mTorr to 100 mTorr (moderate pressure); and DC bias=10 V to 50 V.

10. The method of claim 1 wherein:

said isotropic etching is performed with a wet etchant providing an undercut beneath the edge of said photoresist mask, and said descum operation is performed with a dry plasma process including oxygen gas and an inert gas.

11. The method of claim 1 wherein:

said isotropic etching is performed with a wet etchant providing an undercut beneath the edge of said photoresist mask, and said descum operation is performed with a dry plasma process including oxygen and nitrogen gases and an inert gas as follows:

Inert gas (Ar/He) mixed with $O_2/N_2$=0.1 to 0.4; pressure= 10 mTorr to 30 mTorr (low pressure); and DC bias=60 V to 90 V (increase ion bombardment using inert Ar/He gases at lower pressure).

12. The method of claim 1 wherein:

said isotropic etching being performed with a wet etchant providing an undercut beneath the edge of said photoresist mask, said descum operation being performed with a dry plasma process including oxygen and nitrogen gases and an inert gas selected from argon and helium, and said after stripping inspection dimension measurement of said metal mask being performed with a laser interferometric system.

13. A method of forming a metal mask from a chromium metal layer deposited upon a quartz substrate patterned for exposure of a workpiece to radiation of a specific range of wavelengths with said substrate being transparent to said radiation, said method comprising the sequential steps as follows:

form said chromium metal layer superjacent to said quartz substrate, form a passivated chromium layer on said chromium metal layer, form a photoresist layer superjacent to said passivated chromium layer, expose said photoresist layer to a pattern, develop said photoresist to form a photoresist mask with at least one opening therethrough down to said passivated chromium layer, with sidewalls of said at least one opening having sidewall angles θ substantially less than an ideal vertical angle (90°), bake said photoresist mask, said passivated chromium layer, said metal layer and said quartz substrate, perform a descum operation to form more vertical sidewalls of said photoresist mask, perform an isotropic etching of said metal layer with a wet etchant etching through said at least one opening through said photoresist mask to form said metal mask providing an undercut beneath the edge of said photoresist mask, perform an after etching inspection dimension measurement of said metal mask, strip said photoresist mask, and perform an after stripping inspection dimension measurement of said metal mask with a laser interferometric system.

14. The method of claim 13 wherein said isotropic etching is performed with a wet chlorofluorocarbon etchant providing said undercut beneath the edge of said photoresist mask.

15. The method of claim 13 wherein said descum operation is performed with a dry plasma process.

16. The method of claim 13 wherein said descum operation is performed with a dry plasma process including oxygen and nitrogen gases.

17. The method of claim 13 wherein said descum operation is performed with a dry plasma process including oxygen gas and an inert gas.

18. The method of claim 13 wherein said descum operation is performed with a dry plasma process including oxygen and nitrogen gases and an inert gas.

19. The method of claim 13 wherein said descum operation is performed with a dry plasma process including oxygen and nitrogen gases and an inert gas selected from argon and helium.

20. The method of claim 13 wherein:

said isotropic etching is performed with a wet chlorofluorocarbon etchant providing said undercut beneath the edge of said photoresist mask and said descum operation is performed with a dry plasma process.

21. The method of claim 13 wherein:

said isotropic etching is performed with a wet chlorofluorocarbon etchant, and said descum operation is performed with a dry plasma process including oxygen and nitrogen gases as follows:

Initial recipe $O_2/N_2$=0.1 to 0.4; pressure=50 mTorr to 100 mTorr (moderate pressure); and DC bias=10 V to 50 V.

22. The method of claim 13 wherein:

said isotropic etching is performed with a wet chlorofluorocarbon etchant, and said descum operation is performed with a dry plasma process including oxygen gas and an inert gas.

23. The method of claim 13 wherein:

said isotropic etching is performed with a wet chlorofluorocarbon etchant providing said undercut beneath the edge of said photoresist mask, and said descum operation is performed with a dry plasma process including oxygen and nitrogen gases and an inert gas as follows:

Inert gas (Ar/He) mixed with $O_2/N_2$=0.1 to 0.4; pressure= 10 mTorr to 30 mTorr (low pressure); and DC bias=60 V to 90 V; (increase ion bombardment using inert Ar/He gases at lower pressure).

24. The method of claim 13 wherein:

said isotropic etching is performed with a wet chlorofluorocarbon etchant providing said undercut beneath the edge of said photoresist mask, and said descum operation is performed with a dry plasma process including oxygen and nitrogen gases and an inert gas selected from argon and helium.

* * * * *